US008513863B2

(12) United States Patent
Stephanou et al.

(10) Patent No.: US 8,513,863 B2
(45) Date of Patent: Aug. 20, 2013

(54) PIEZOELECTRIC RESONATOR WITH TWO LAYERS

(75) Inventors: Philip J. Stephanou, Berkeley, CA (US); Justin P. Black, Berkeley, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 1095 days.

(21) Appl. No.: 12/456,245

(22) Filed: Jun. 11, 2009

(65) Prior Publication Data

US 2012/0274184 A1    Nov. 1, 2012

(51) Int. Cl.
*H01L 41/08* (2006.01)

(52) U.S. Cl.
USPC ............ 310/345; 310/364; 310/365; 310/366

(58) Field of Classification Search
USPC ............. 310/328, 321–323, 345, 324, 313 A, 310/313 B, 313 R, 311, 353, 363–366, 320, 310/348, 349, 351; 333/186, 189, 197
IPC ............................................ H01L 41/09, 41/08
See application file for complete search history.

(56) References Cited

U.S. PATENT DOCUMENTS

| | | | |
|---|---|---|---|
| 3,486,046 A | 12/1969 | Zalar | |
| 3,634,787 A | 1/1972 | Newell | |
| 4,104,553 A | 8/1978 | Engdahl et al. | |
| 4,350,918 A | 9/1982 | Sato | |
| 4,456,850 A | 6/1984 | Inoue et al. | |
| 4,571,519 A | 2/1986 | Kawabata et al. | |
| 4,583,017 A | 4/1986 | Nakamura et al. | |
| 4,608,509 A | 8/1986 | Yamamoto et al. | |
| 4,658,173 A | 4/1987 | Nakamura et al. | |

(Continued)

FOREIGN PATENT DOCUMENTS

| | | |
|---|---|---|
| EP | 0 534 389 | 3/1993 |
| EP | 1 538 747 B1 | 6/2005 |

(Continued)

OTHER PUBLICATIONS

Volatier et al., "UHF/VHF Resonators using Lamb Waves Co-Integrated with Bulk Acoustic Wave resonators," Proceedings of IEEE 2005 Ultrasonics Symposium, pp. 902-905.

(Continued)

*Primary Examiner* — Thomas Dougherty
*Assistant Examiner* — Karen B Addison
(74) *Attorney, Agent, or Firm* — Weaver Austin Villeneuve & Sampson LLP

(57) ABSTRACT

A piezoelectric resonator device includes: a top electrode layer with a patterned structure, a top piezoelectric layer adjacent to the top layer, a middle metal layer adjacent to the top piezoelectric layer opposite the top layer, a bottom piezoelectric layer adjacent to the middle layer opposite the top piezoelectric layer, and a bottom electrode layer with a patterned structure and adjacent to the bottom piezoelectric layer opposite the middle layer. The top layer includes a first plurality of electrodes inter-digitated with a second plurality of electrodes. A first one of the electrodes in the top layer and a first one of the electrodes in the bottom layer are coupled to a first contact, and a second one of the electrodes in the top layer and a second one of the electrodes in the bottom layer are coupled to a second contact.

27 Claims, 12 Drawing Sheets

(56) References Cited

U.S. PATENT DOCUMENTS

| | | | |
|---|---|---|---|
| 4,719,383 | A | 1/1988 | Wang et al. |
| 5,162,691 | A | 11/1992 | Mariani et al. |
| 5,187,458 | A | 2/1993 | Yamashita et al. |
| 5,274,293 | A | 12/1993 | Inoue et al. |
| 5,320,865 | A | 6/1994 | Nakahata et al. |
| 5,548,179 | A | 8/1996 | Kaida |
| 5,548,180 | A | 8/1996 | Kaida |
| 5,552,655 | A | 9/1996 | Stokes et al. |
| 5,635,882 | A | 6/1997 | Kaida |
| 5,648,746 | A | 7/1997 | Kaida |
| 5,701,048 | A | 12/1997 | Kaida |
| 5,717,365 | A | 2/1998 | Kaida et al. |
| 6,268,684 | B1 | 7/2001 | Yokoi |
| 6,271,619 | B1 | 8/2001 | Yamada et al. |
| 6,657,363 | B1 * | 12/2003 | Aigner .................. 310/324 |
| 6,675,450 | B1 | 1/2004 | Fetter et al. |
| 6,734,762 | B2 | 5/2004 | Cornett et al. |
| 6,828,713 | B2 | 12/2004 | Bradley et al. |
| 6,909,221 | B2 | 6/2005 | Ayazi et al. |
| 6,931,701 | B2 | 8/2005 | Yamada et al. |
| 7,005,946 | B2 | 2/2006 | Duwel et al. |
| 7,038,358 | B2 | 5/2006 | Bryant et al. |
| 7,156,938 | B2 | 1/2007 | Baumgartner et al. |
| 7,202,591 | B2 | 4/2007 | Arbogast et al. |
| 7,295,088 | B2 | 11/2007 | Nguyen et al. |
| 7,296,329 | B1 | 11/2007 | Barber et al. |
| 7,312,674 | B2 | 12/2007 | Duwel et al. |
| 7,385,467 | B2 | 6/2008 | Stoemmer et al. |
| 7,489,063 | B2 * | 2/2009 | Isobe et al. ............ 310/312 |
| 7,489,067 | B2 | 2/2009 | Metzger et al. |
| 7,492,241 | B2 | 2/2009 | Piazza et al. |
| 7,586,239 | B1 | 9/2009 | Li et al. |
| 7,888,843 | B2 * | 2/2011 | Ayazi et al. ............ 310/324 |
| 2003/0117236 | A1 | 6/2003 | Barber et al. |
| 2004/0021403 | A1 | 2/2004 | Ayazi et al. |
| 2004/0027214 | A1 | 2/2004 | Duwel et al. |
| 2005/0140467 | A1 | 6/2005 | Duwel et al. |
| 2006/0273867 | A1 | 12/2006 | Piazza et al. |
| 2006/0290449 | A1 | 12/2006 | Piazza et al. |
| 2007/0267942 | A1 | 11/2007 | Matsumoto et al. |
| 2009/0102316 | A1 | 4/2009 | Belot et al. |

FOREIGN PATENT DOCUMENTS

| | | |
|---|---|---|
| EP | 2441171 | 4/2012 |
| JP | 51 150991 | 12/1976 |
| TW | 201136153 A | 10/2011 |
| WO | WO 02/17482 A2 | 2/2002 |
| WO | WO 02/087081 A1 | 10/2002 |
| WO | WO 2006/126168 | 11/2006 |
| WO | WO2010144728 | 12/2010 |

OTHER PUBLICATIONS

Yantchev et al., "Design and Fabrication of Thin Film Lamb Wave Resonators Utilizing Longitudinal Wave and Interdigital Transducers," Proceedings of IEEE 2005 Ultrasonics Symposium, pp. 1580-1583.

Piazza et al. "Single-Chip Multiple-Frequency Filters Based on Contour Mode Aluminum Nitride Piezoelectric Micromechanical Resonators," Proceedings of IEEE 2005 Transducers Conference, pp. 2065-2068.

PCT International Search Report and Written Opinion dated Oct. 10, 2010 issued in Application No. PCT/US20108/038209, 11 pages.

Ho et al. "High Order Composite Bulk Acoustic Resonators", MEMS 2007, Kobe, Japan, Jan. 21-25, 2007. pp. 791-794.

Piazza et al. "Two-Port Stacked Contour-Mode Aluminum Nitride Piezoelectric Micromechanical Resonators" Barcelona, Sep. 11-14, 2005: www.seas.upenn.edu/~piazza/Papers/Piazza_EuroSensors05.pdf.

Stephanou et al. "Miniaturized Multi-Band Filter Banks for Extravehicular Radio (EVA) Applications", Radio Frequency Integrated Circuits Symposium, 2008. RFIC 2008. IEEE vol. , Issue , Jun. 17, 2008-Apr. 17, 2008 pp. 171-174.

Stephanou et al. "Piezoelectric Aluminum Nitride MEMS Annular Dual Contour Mode Filter", Sensors and Actuators A: Physical vol. 134, Issue 1, Feb. 28, 2007, pp. 152-160, International Mechanical Engineering congress and Exposition 2005—IMECE 2005, American Society of Mechanical Engineering International Mechanical Engineering Congress and Exposition.

Philip Jason Stephanou "Piezoelectric Aluminum Nitride MEMS Resonators for RF Signal Processing" (PhD dissertation, Graduate Division of University of California, Berkeley, Fall 2006), 1-186.

Stephanou et al. "GHZ Higher Order Contour Mode ALN Annular Resonators", Micro Electro Mechanical Systems, 2007. MEMS. IEEE 20th International Conference on vol. , Issue , Jan. 21-25, 2007 pp. 787-790.

Stephanou et al. "Contour Mode Piezoelectric Aluminum Nitride MEMS Resonators for RF Filtering" 2008 IEEE Radio and Wireless Symposium, Jan. 22-24, 2008, Orlando Florida.

Stephanou et al. "GHZ Contour Extensional Mode Aluminum Nitride MEMS Resonators" Ultrasonics Symposium, 2006. IEEE, Oct. 2-6, 2006, pp. 2401-2404, Vancouver, BC, Canada.

G. Piazza, P. J. Stephanou, and A.P. Pisano, "Piezoelectric aluminum nitride vibrating contour-mode MEMS resonators", Journal of Microelectromechanical Systems, pp. 1406-1418, 2006.

International Preliminary Report on Patentability—PCT/US2010/038209, The International Bureau of WIPO—Geneva, Switzerland, Jun. 1, 2011.

* cited by examiner

PIEZOELECTRIC RESONATOR WITH TWO LAYERS

This work was supported by NASA Phase I SBIR NNJ07JB04C.

BACKGROUND OF THE INVENTION

Micro-electromechanical system (MEMS) filters have advantages in being able to reduce the size, weight, and power required when used as part of electronic systems such as radios. However, MEMS-type filters have limitations. For example, thickness MEMS-type filters (e.g., thickness-extensional mode piezoelectric resonators) are typically limited to a single operating frequency per substrate die. For another example, lithographically-determined operating frequency resonators (e.g., contour-extensional polysilicon resonators) cannot meet low impedance (e.g., 50 Ω) specifications.

BRIEF DESCRIPTION OF THE DRAWINGS

Various embodiments of the invention are disclosed in the following detailed description and the accompanying drawings.

DETAILED DESCRIPTION

Figure 1:
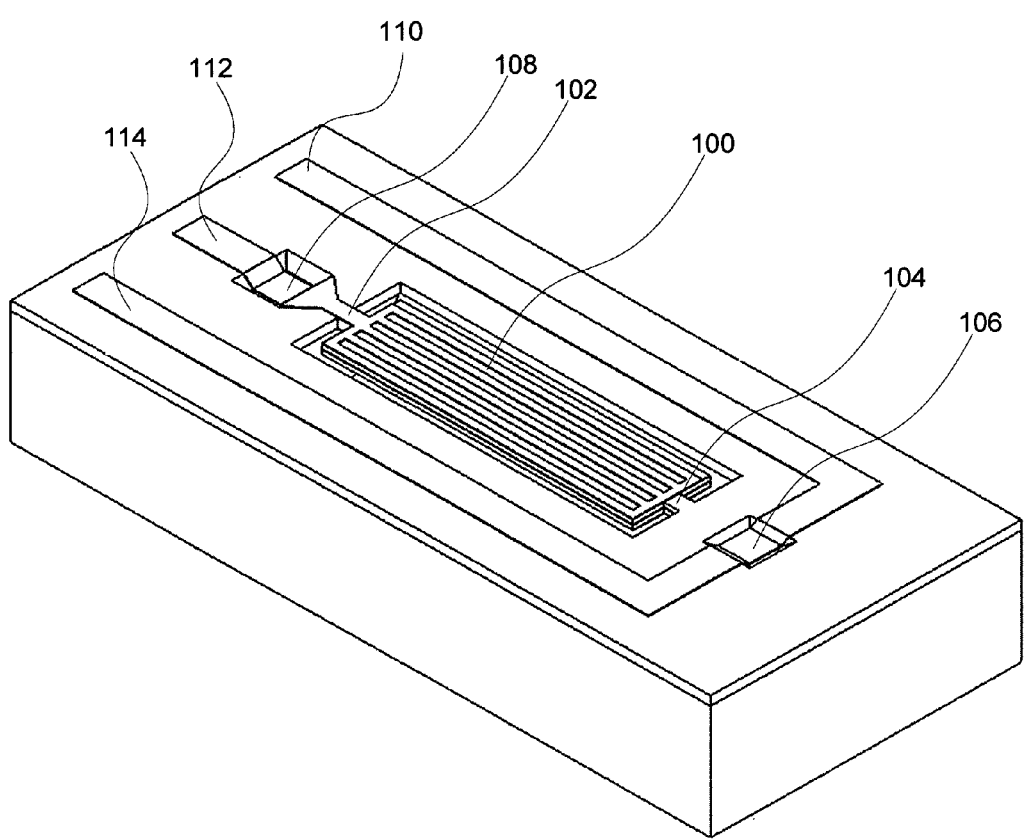
FIG. 1 is a block diagram illustrating an embodiment of a piezoelectric resonator with two piezoelectric layers.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Micro-electromechanical systems (MEMS) piezoelectric resonators with two piezoelectric layers are disclosed. A piezoelectric resonator device comprises a set of layers suspended using tethers. The set of layers comprises two piezoelectric layers separated by a middle metal layer and metal electrode layers adjacent to the outside of the piezoelectric layers (e.g., metal electrode layer, piezoelectric layer, middle metal layer, piezoelectric layer, and metal electrode layer). The metal electrode layers have patterns of electrodes that are correlated with each other. The metal electrodes on the top and bottom layer and middle metal layer are used to apply, sense, or apply and sense an electric potential across each of the two piezoelectric layers. The piezoelectric effect of the piezoelectric layers transduces the electric potential across each layer into mechanical stress in the layer. The inverse piezoelectric effect of the piezoelectric layers transduces the mechanical stress in each piezoelectric layer into an electric potential across the layer. The resonator structure can be operated at mechanical resonance by varying the applied electric field in time at the natural frequency of the device. In various embodiments, the piezoelectric layer is comprised of one of the following: aluminum nitride, zinc oxide, lead zirconate titanate, quartz, gallium arsenide, lithium niobate, or any other appropriate material. In various embodiments, the two piezoelectric layers are comprised of different materials or are comprised of the same materials. The spacing of the electrodes and the connectivity of the electrodes and the middle metal layer determine a frequency response of the resonator structure.

In various embodiments, the top metal electrodes, the middle metal layer, and/or the bottom metal electrodes is/are comprised of the following: aluminum, platinum, molybdenum, gold, silver, nickel, ruthenium, or any other appropriate metal. In various embodiments, the top metal electrodes, the middle metal layer, and/or the bottom metal electrodes are comprised of the same metals or are comprised of different metals.

In some embodiments, the two layers of metal electrodes have patterns that alternate areas such that when viewed from the top or bottom of the set of layers, the electrode areas on the top are centered in a space between electrode areas on the bottom and the electrode areas on the bottom are centered in a space between electrode areas on the top. In various embodiments, the areas comprise approximately rectangular areas in an area of the layer, approximately concentric arcs or portions of circles in an area of the layer, or any other appropriate shape. In various embodiments, the electrodes have approximately the same width as the space between electrode areas, are less wide compared to the space between the electrode areas, are wider compared to the space between the electrode areas, or any other appropriate width. The magnitude of the electromechanical coupling factor of the piezoelectric resonator is a function of the relative width of the electrode compared to the width of the space between electrode areas.

In some embodiments, the top layer of metal electrodes and the bottom metal electrodes are electrically coupled to each other.

In some embodiments, each of the layers of metal electrodes (e.g., top layer and bottom layer) include two sets of inter-digitated electrodes, where one set of top electrodes is coupled to one set of bottom electrodes and the other set of top electrodes is coupled to the other set of bottom electrodes. In various embodiments, the coupled sets on top and bottom layers are electrically coupled such that the top and bottom set that sit correspondingly above and below each other are coupled or such that the top and bottom set that site correspondingly above and below each other are not coupled.

In some embodiments, for a given lithographically-defined metal electrode line width, a two layer piezoelectric resonator device enables twice the maximum operating frequency of that achievable by single layer piezoelectric resonator device. A larger line width for a given frequency of operation is desirable as it: 1) reduces lithographic tolerances (e.g., which is favorable because MEMS fabrication equipment is often several generations behind state-of-the-art for CMOS and because lithography of the MEMS device must accommodate wafer topography(e.g., step heights measuring several microns); 2) decreases Ohmic loading in electrodes (e.g., Ohmic loading is associated with electrode resistance, which destroys the Q of low impedance resonators); 3) increases transduction efficiency by allowing electrodes to cover a larger fraction of a lateral strain field (e.g., which is favorable because it includes more charge associated with the motion of a piezoelectric structure of the resonator structure); and 4) makes the forcing function couple more efficiently into a desired mode of vibration and suppresses undesired modes of plate by having the additional transducer layer (e.g., this is especially effective for 2-port topologies).

In some embodiments, as compared to a two layer unpatterned electrode structure, a two layer patterned resonator structure has the following advantages: 1) forcing the resonator structure with periodic and/or alternating polarity potentials couples more efficiently into a desired mode of vibration and suppresses undesired modes of the resonator structure; 2) allows the impedance of the resonator structure to be scaled down by increasing number of electrodes; 3) increases the frequency setting accuracy and/or decreases need for trimming, because variations in structure width have 1/n times the effect on the device frequency as compared to a device operating in a fundamental width extensional mode of the resonator structure, where n is the number of half-wavelength periods (e.g., number of electrodes) on the surfaces of the resonator; and 4) the thickness-extensional response, that appears in characteristic response of all lateral-extensional mode devices, is less pronounced.

FIG. 1 is a block diagram illustrating an embodiment of a piezoelectric resonator with two piezoelectric layers. In the example shown, resonator structure 100 is suspended over a cavity using tether 102 and tether 104. The lateral dimensions of resonator structure 100 are typically on the order of a few hundred microns by a few hundred microns for a device designed to operate around 1 GHz and up to a few 1000 microns by a few 1000 microns for a device designed to operate at 10 MHz; each piezoelectric layer is typically 0.5 to 3 microns thick. The tether 104 is defined in the same piezoelectric layers that make up the resonator structure 100, and are typically 5 microns wide and designed such that their length (in the direction connecting the resonator structure to its surroundings) is an integer number of resonant quarter wavelengths. Resonator structure 100 comprises a set of layers including a top metal electrode layer, a top piezoelectric layer beneath the top metal electrode layer, a middle metal layer beneath the top piezoelectric layer, a bottom piezoelectric layer beneath the middle metal layer, and a bottom metal electrode layer beneath the bottom piezoelectric layer. The middle metal layer is coupled electrically through tether 104 to via 106 and to contact strip 110 and contact strip 114. The top metal electrode layer and the bottom metal electrode layer are coupled electrically through tether 102 to via 108 and to contact strip 112. Contact strip 110/contact strip 114 and contact strip 112 can be used as 1-port connections to resonator structure 100, where for example, contact strip 110/contact strip 114 are coupled to ground and contact strip 112 is coupled to a signal input. Resonator structure 100 includes a pattern of metal electrodes on the top and bottom surfaces that when provided an input signal has a vibrational response that coupled to resonator structures electrical response. The vibrational response is a vibrational oscillation mode along an axis perpendicular to the axis between tether 102 and tether 104. The top and bottom metal electrodes have a periodic structure in along the axis perpendicular to the axis between tether 102 and tether 104 in an area of the surface of resonator structure 100 that includes all but the bus connector strips at either end of resonator structure 100. The resonant frequency response of resonator structure 100 is controlled by selecting the periodicity of the periodic structure on the surface. The frequency of resonance is proportional to 1/(perdiod of the electrodes) and is related to the speed of elastic wave propagation in the piezoelectric material(s) in the top piezoelectric layer and the bottom piezoelectric layer. For example, an electrode period of 10 microns corresponds to a resonant frequency of approximately 1 GHz if the resonator structure is made of aluminum nitride. At resonance, the elastic wave propagating in the piezoelectric layer has a half-wavelength that is equal to the period of the patterned electrodes. The structure can be driven into resonance by applying a harmonic electric potential that varies in time at the structure resonant frequency across the patterned metal layers. The layout and interconnectivity of the periodic electrodes preferentially transduces the desired mode of vibration while suppressing the response of undesired spurious modes of vibration of the structure. For example, a specific higher order vibrational mode can be transduced without substantially transducing other modes. Compared to its response to a constant DC electric potential, the amplitude of the mechanical response of the resonator is multiplied by the quality factor (the typical quality factor is on the order of 500 to 5000). Selection of the length of resonator structure 100 along the axis between tether 102 and tether 104 and the number of electrode periods provides control over the impedance of resonator structure 100 by scaling the amount of charge generated by the motion of the piezoelectric material.

Figure 2:
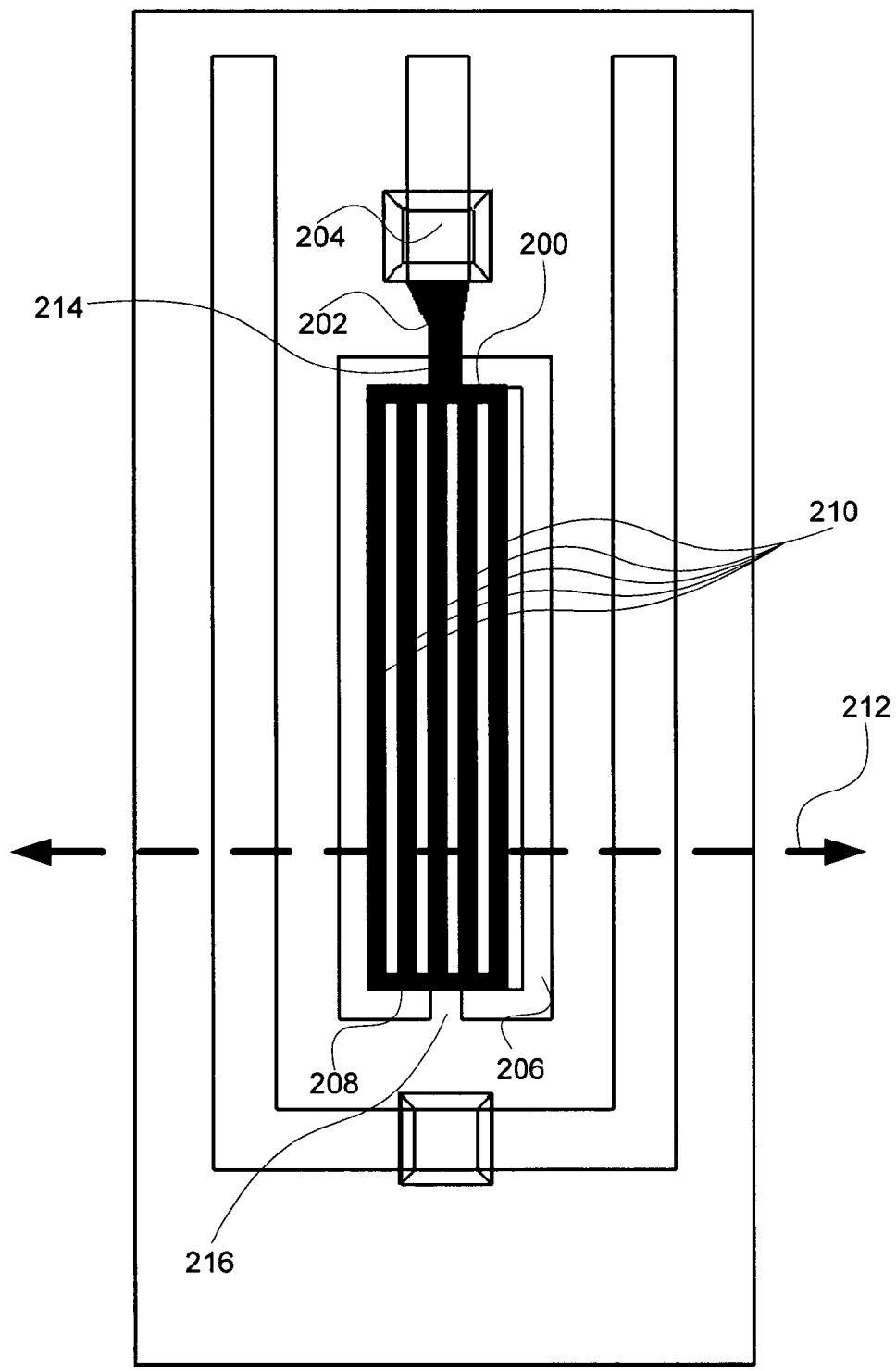
FIG. 2 is a diagram illustrating an embodiment of a top view of top metal electrodes of a piezoelectric resonator with two piezoelectric layers.

FIG. 2 is a diagram illustrating an embodiment of a top view of top metal electrodes of a piezoelectric resonator with two piezoelectric layers. In some embodiments, the metal electrodes of FIG. 2 are used to implement the metal electrodes associated with the resonator of FIG. 1. In the example shown, a resonator structure has electrically coupled bus 200, periodic stripes 210, and bus 208 as part of the top layer metal electrode seen from a top view. Bus 200, periodic stripes 210, and bus 208 are electrically coupled to via 204 using connector 202. Connector 202 crosses tether 214, which is used to suspend the resonator structure. The resonator structure is surrounded by space 206 and is coupled to the structure surrounding the resonator structure using tether 214 and tether 216. Periodic stripes 210 are periodic along a direction perpendicular to an axis that would run between tether 214 and tether 216—for example, along axis 212. Periodic stripes 210 have alternating areas of metal and areas without metal along the direction associated with line 212. In various embodiments, the areas of metal and the areas without metal have the same width, the areas of metal are wider than the areas without metal, the areas of metal are narrower than the areas without metal, or any other appropriate relation between the widths. The widths of the areas with and without metal electrodes are typically on the order of 5 microns each for resonators designed to operate at 1 GHz; the metal electrode thickness is typically on the order of 100 to 300 nanometers. The magnitude of the electromechanical coupling factor of the piezoelectric resonator is a function of the relative width of the electrode compared to the width of the space between electrode areas. In some embodiments, the resonator electromechanical coupling is a nonlinear function of the electrode/space width ratio. In some embodiments, the width of the metal electrodes is not a width corresponding to the full half period of the electrode spacing (e.g., equal to the full half period of the electrode spacing) because the resonator electromechanical coupling is more efficient when the metal electrode width is less than the full half period of the electrode spacing. In some embodiments, the optimal value of the electrode/space width ratio is approximately 74%. Periodic stripes 210 are arranged in such a manner that the areas without metal are directly over a set of periodic stripes in the bottom metal electrode.

Figure 3:
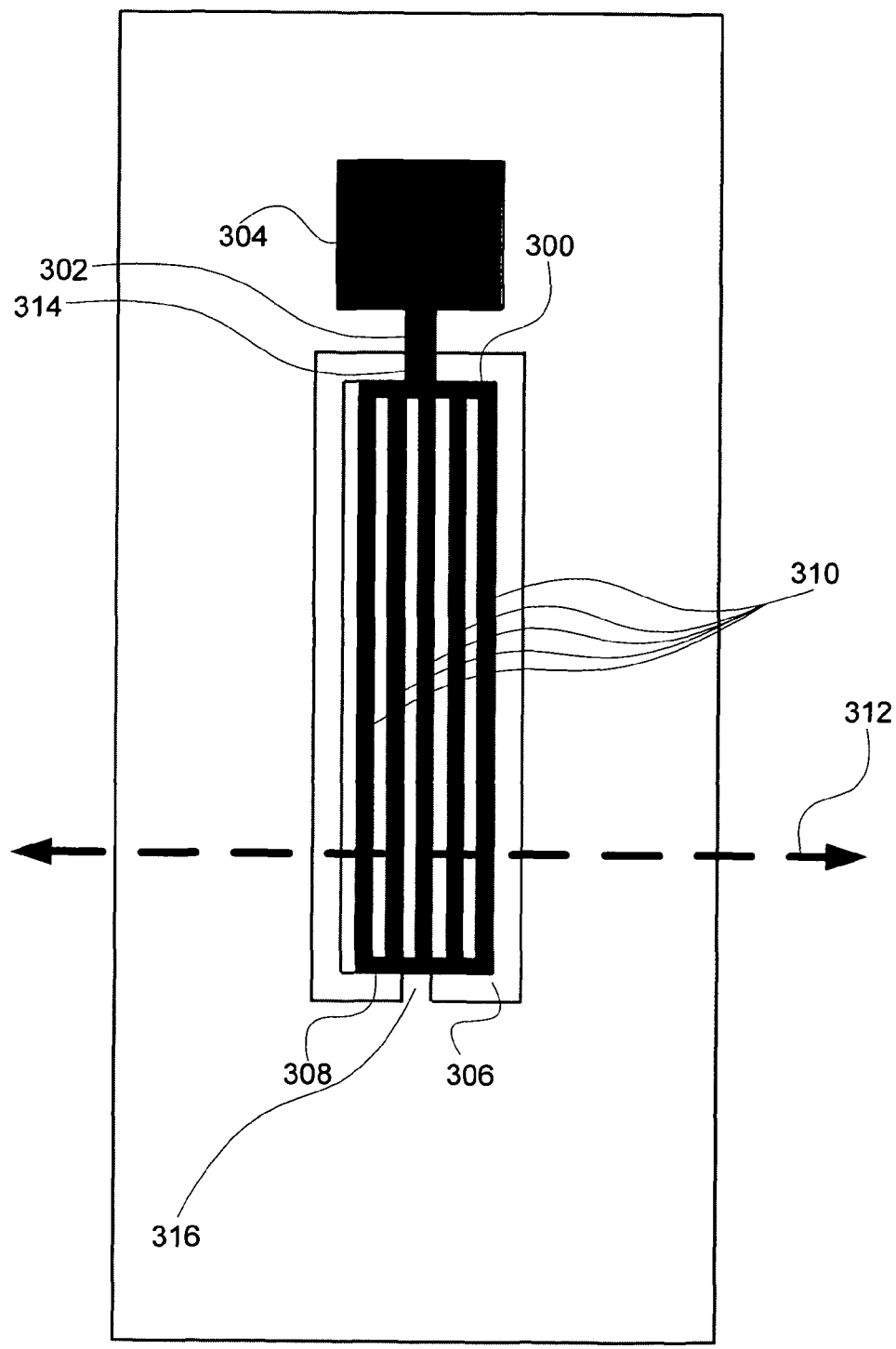
FIG. 3 is a diagram illustrating an embodiment of a top view of bottom metal electrodes of a piezoelectric resonator with two piezoelectric layers.

FIG. 3 is a diagram illustrating an embodiment of a top view of bottom metal electrodes of a piezoelectric resonator with two piezoelectric layers. In some embodiments, the metal electrodes of FIG. 3 are used to implement the metal electrodes associated with the resonator of FIG. 1. In the example shown, a resonator structure has electrically coupled bus 300, periodic stripes 310, and bus 308 as part of the bottom layer metal electrode seen from a top view. Bus 300, periodic stripes 310, and bus 308 are electrically coupled to via contact 304 using connector 302. Connector 302 crosses tether 314, which is used to suspend the resonator structure. The resonator structure is surrounded by space 306 and is coupled to the structure surrounding the resonator structure using tether 314 and tether 316. Periodic stripes 310 are periodic along a direction perpendicular to an axis that would run between tether 314 and tether 316—for example, along axis 312. Periodic stripes 310 have alternating areas of metal and areas without metal along the direction associated with line 312. In various embodiments, the areas of metal and the areas without metal have the same width, the areas of metal are wider than the areas without metal, the areas of metal are narrower than the areas without metal, or any other appropriate relation between the widths. The widths of the areas with and without metal electrodes are typically on the order of 5 microns each for resonators designed to operate at 1 GHz; the metal electrode thickness is typically on the order of 100 to 300 nanometers. The magnitude of the electromechanical coupling factor of the piezoelectric resonator is a function of the relative width of the electrode compared to the width of the space between electrode areas. Periodic stripes 310 are arranged in such a manner that the areas without metal are directly underneath periodic stripes 210.

Figure 4:
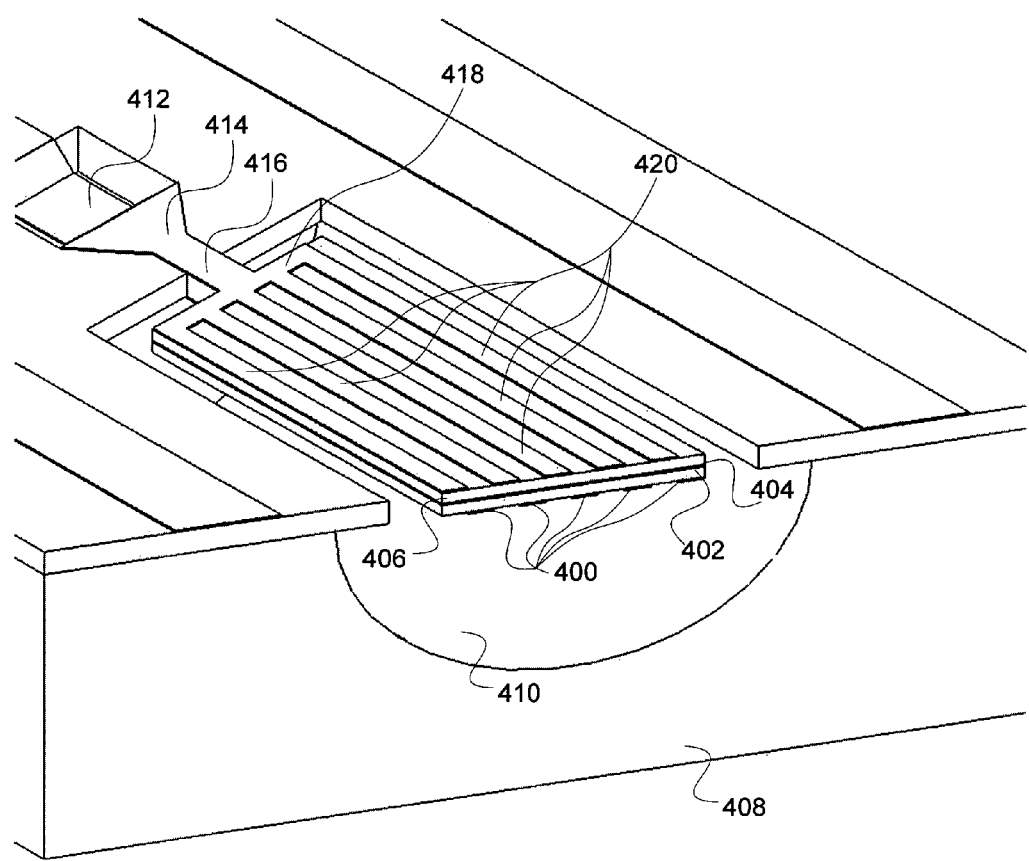
FIG. 4 is a block diagram illustrating an embodiment of a piezoelectric resonator with two piezoelectric layers.

FIG. 4 is a block diagram illustrating an embodiment of a piezoelectric resonator with two piezoelectric layers. In some embodiments, the resonator of FIG. 4 is used to implement the resonator of FIG. 1. In the example shown, periodic stripes 420 are coupled electrically to bus 418 which in turn is electrically coupled to connector 414 and via 412. Connector 414 crosses tether 416. Tether 416 suspends a resonator structure over cavity 410 within substrate 408. The resonator structure comprises: 1) a top layer of metal electrodes including periodic stripes 420 and bus 418; 2) top piezoelectric layer 404; 3) middle metal layer 406; 4) bottom piezoelectric layer 402; and 5) bottom layer of metal electrodes including periodic stripes 400. Top layer periodic stripes 420 are centered over spaces between bottom layer periodic stripes 400. Similarly, spaces between top layer periodic stripes 420 are centered over bottom layer periodic stripes 400.

Figure 5A:
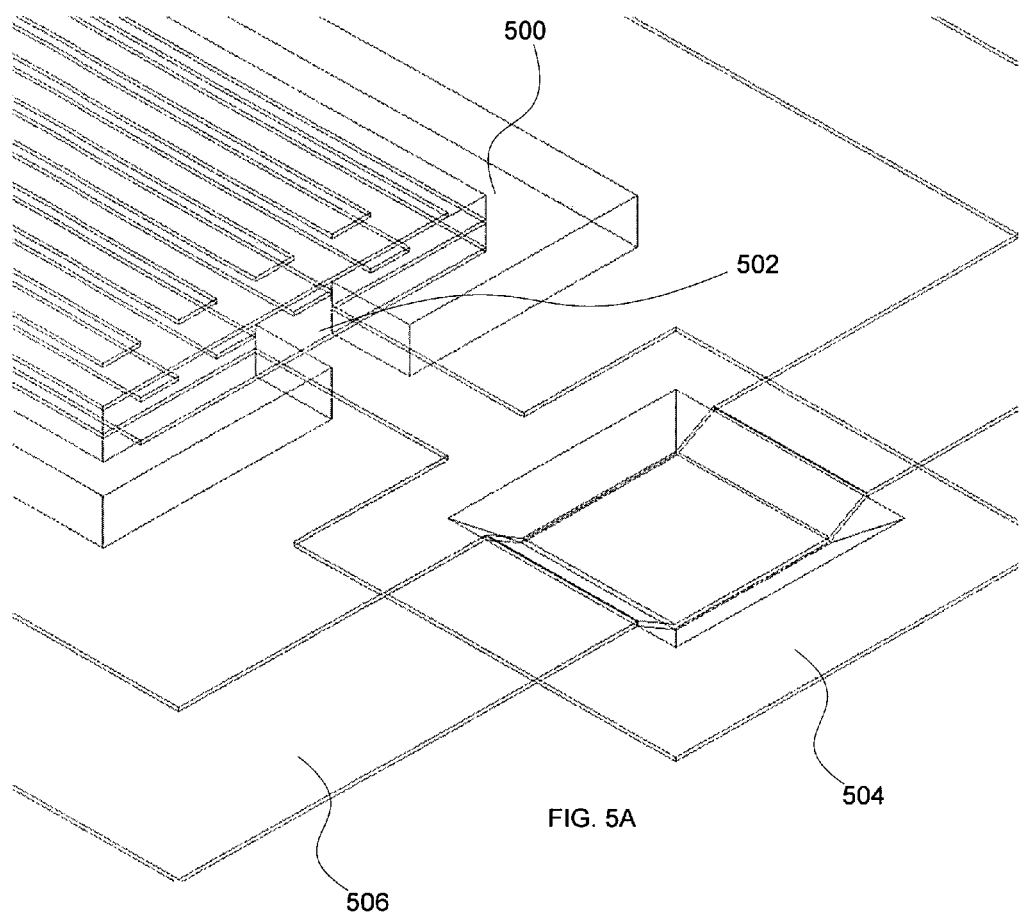
FIGS. 5A and 5B are diagrams illustrating embodiments of a via connecting to a middle metal layer.
Figure 5B:
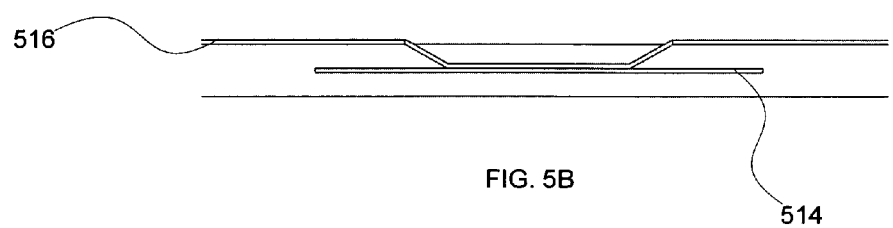

FIGS. 5A and 5B are diagrams illustrating embodiments of a via connecting to a middle metal layer. In some embodiments, the vias of FIGS. 5A and 5B are used to implement the vias associated with the resonator of FIG. 1. In the example shown, a resonator structure is coupled to substrate using tether 502. The resonator structure is separated from the substrate by space 500. Metal connector 504 is coupled electrically to a middle metal layer in the resonator structure and crosses to the resonator structure on tether 502. Contact strip 506 is coupled electrically with metal connector 504 using a via. In the cross section shown in FIG. 5B, metal connector 514 is coupled electrically to contact strip 516. In some embodiments, metal connector 514 corresponds to metal connector 504 and contact strip 516 corresponds to contact strip 506.

Figure 6A:
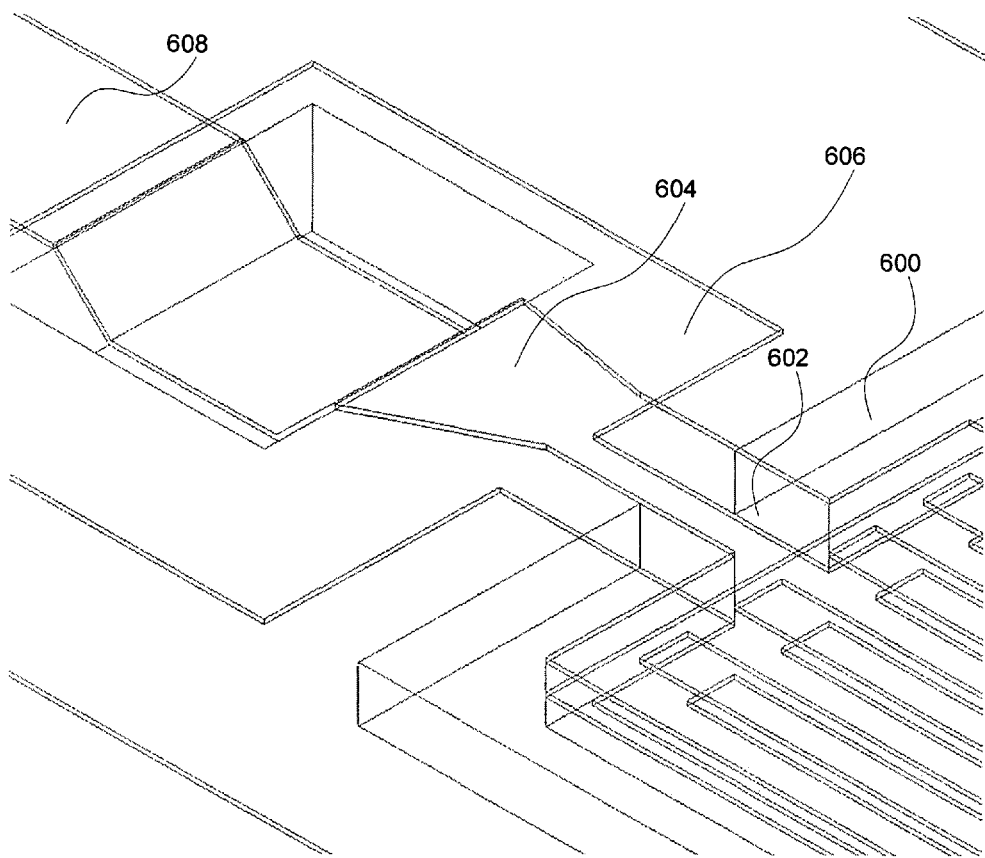
FIGS. 6A and 6B are diagrams illustrating embodiments of a via connecting to top and bottom metal electrode layers.
Figure 6B:
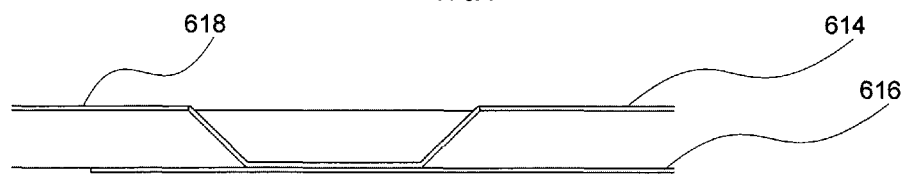

FIGS. 6A and 6B are diagrams illustrating embodiments of a via connecting to top and bottom metal electrode layers. In some embodiments, the vias of FIGS. 6A and 6B are used to implement the vias associated with the resonator of FIG. 1. In the example shown, a resonator structure is coupled to substrate using tether 602. The resonator structure is separated from the substrate by space 600. Metal connector 604 is coupled electrically to a top metal electrode layer in the resonator structure and crosses to the resonator structure on tether 602. Metal connector 606 is coupled electrically to a bottom metal electrode layer in the resonator structure and crosses to the resonator structure on tether 602. Contact strip 608 is coupled electrically with metal connector 604 and metal connector 606 using a via. In the cross section shown in FIG. 6B, metal connector 614 is coupled electrically to metal connector 616 and contact strip 618. In some embodiments, metal connector 614 corresponds to metal connector 604, metal connector 616 corresponds to metal connector 606, and contact strip 618 corresponds to contact strip 608.

Figure 7:
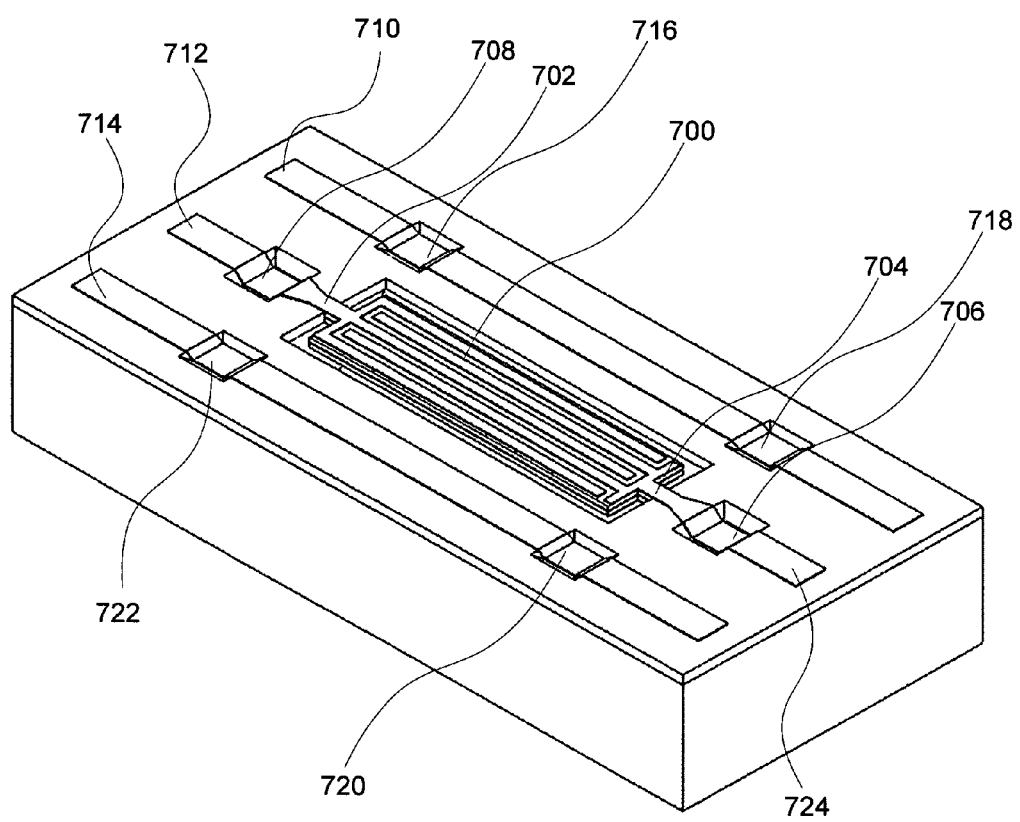
FIG. 7 is a block diagram illustrating an embodiment of a piezoelectric resonator with two piezoelectric layers.

FIG. 7 is a block diagram illustrating an embodiment of a piezoelectric resonator with two piezoelectric layers. In the example shown, resonator structure 700 is suspended over a cavity using tether 702 and tether 704. The lateral dimensions of resonator structure 700 are typically on the order of a few hundred microns by a few hundred microns for a device designed to operate around 1 GHz and up to a few 1000 microns by a few 1000 microns for a device designed to operate at 10 MHz; each piezoelectric layer is typically 0.5 to 3 microns thick. The tether 704 is defined in the same piezoelectric layers that make up the resonator structure 700, and are typically 5 microns wide and designed such that their length (in the direction connecting the resonator structure to its surroundings) is an integer number of resonant quarter wavelengths. Resonator structure 700 comprises a set of layers including a top metal electrode layer, a top piezoelectric layer beneath the top metal electrode layer, a middle metal layer beneath the top piezoelectric layer, a bottom piezoelectric layer beneath the middle metal layer, and a bottom metal electrode layer beneath the bottom piezoelectric layer. The middle metal layer is coupled electrically through tether 702 and tether 704 to via 716, via 718, via 720, and via 722 and to contact strip 710 and contact strip 714. A set of electrodes on the top metal layer and a set of electrodes on the bottom metal layer are coupled electrically through tether 702 to via 708 and to contact strip 712. Another set of electrodes on the top metal layer and another set of electrodes on the bottom metal layer are coupled electrically through tether 704 to via 706 and to contact strip 724. Contact strip 710/contact strip 714 and contact strip 712 and contact strip 724 can be used as 2-port connections to resonator structure 700, where for example, contact strip 710/contact strip 714 are coupled to ground and contact strip 712 is coupled to a signal input/output and contact strip 724 is coupled to another signal input/output. Resonator structure 700 includes a pattern of metal electrodes on the top and bottom surfaces that when provided an input signal has a vibrational response that coupled to resonator structures electrical response. The vibrational response is a vibrational oscillation mode along an axis perpendicular to the axis between tether 702 and tether 704. The top and bottom metal electrodes have a periodic structure in along the axis perpendicular to the axis between tether 702 and tether 704 in an area of the surface of resonator structure 700 that includes all but the bus connector strips at either end of resonator structure 700. The resonant frequency response of resonator structure 700 is controlled by selecting the periodicity of the periodic structure on the surface. The frequency of resonance is proportional to 1/(period of the electrodes) and is related to the speed of elastic wave propagation in the piezoelectric material(s) in the top piezoelectric layer and the bottom piezoelectric layer. For example, an electrode period of 10 microns corresponds to a resonant frequency of approximately 1 GHz if the resonator structure is made of aluminum nitride. At resonance, the elastic wave propagating in the piezoelectric layer has a half-wavelength that is equal to the period of the patterned electrodes. The structure can be driven into resonance by applying a harmonic electric potential that varies in time at the structure resonant frequency across the patterned metal layers. The layout and interconnectivity of the periodic electrodes preferentially transduces the desired mode of vibration while suppressing the response of undesired spurious modes of vibration of the structure. For example, a specific higher order vibrational mode can be transduced without substantially transducing other modes. Compared to its response to a constant DC electric potential, the amplitude of the mechanical response of the resonator is multiplied by the quality factor (the typical quality factor is on the order of 500 to 5000). Selection of the length of resonator structure 700 along the axis between tether 702 and tether 704 and the number of electrode periods provides control over the impedance of resonator structure 700 by scaling the amount of charge generated by the motion of the piezoelectric material.

Figure 8:
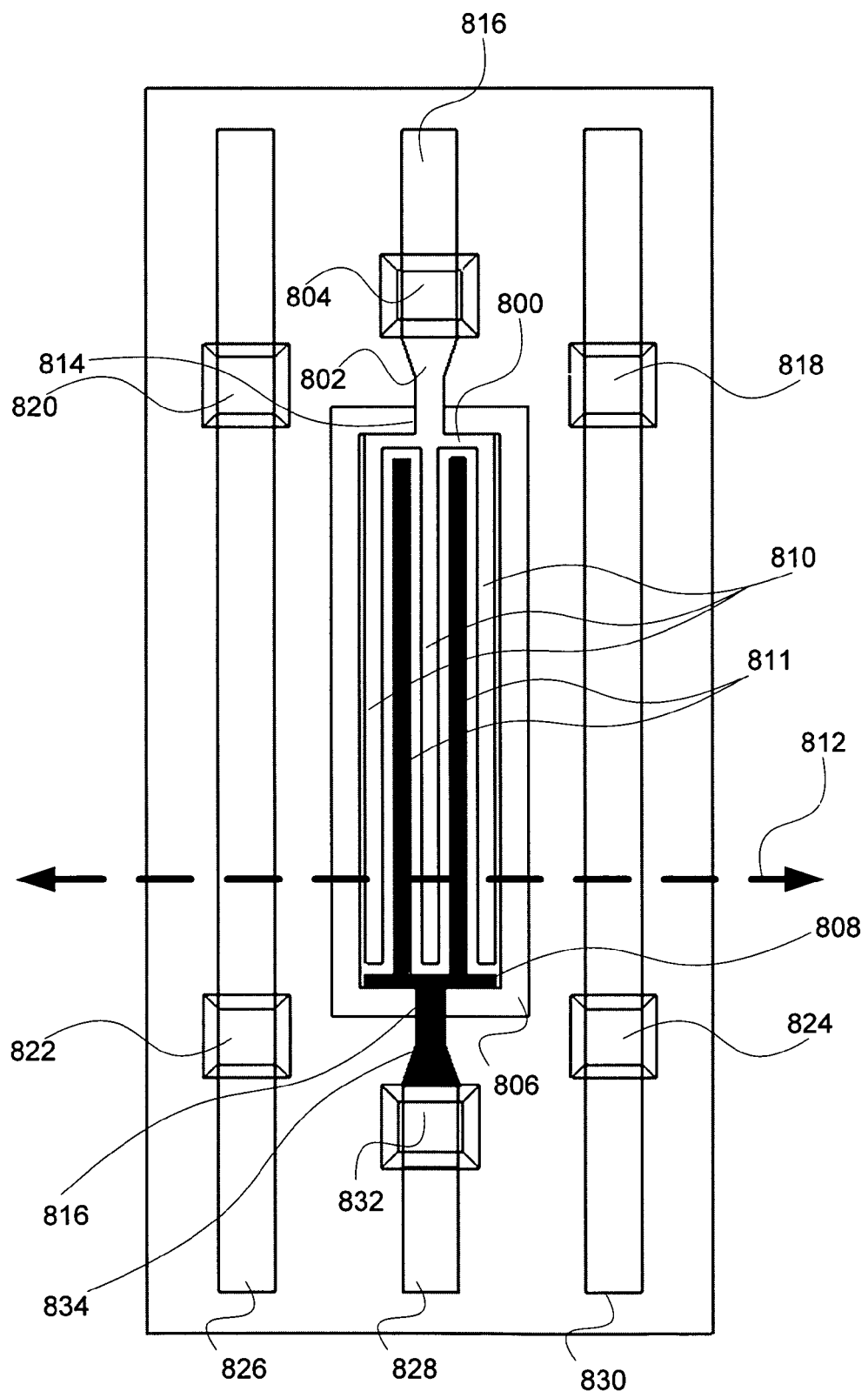
FIG. 8 is a diagram illustrating an embodiment of a top view including top metal electrodes of a piezoelectric resonator with two piezoelectric layers.

FIG. 8 is a diagram illustrating an embodiment of a top view including top metal electrodes of a piezoelectric resonator with two piezoelectric layers. In some embodiments, the metal electrodes of FIG. 8 are used to implement the metal electrodes associated with the resonator of FIG. 7. In the example shown, a resonator structure has electrically coupled bus 800, periodic stripes 810, periodic stripes 811, and bus 808 as part of the top layer metal electrode seen from a top view. Bus 800 and periodic stripes 810 are electrically coupled to via 804 and contact strip 816 using connector 802. Connector 802 crosses tether 814, which is used to suspend the resonator structure. The resonator structure is surrounded by space 806 and is coupled to the structure surrounding the resonator structure using tether 814 and tether 816. Periodic stripes 811 and bus 808 are electrically coupled to via 832 and contact strip 828 using connector 834.

Periodic stripes 810 and periodic stripes 811 are periodic along a direction perpendicular to an axis that would run between tether 814 and tether 816—for example, along axis 812. Periodic stripes 810 and periodic stripes 811 are inter-digitated and have areas of metal separated by an area without metal along the direction associated with line 812. In various embodiments, the areas of metal and the areas without metal have the same width, the areas of metal are wider than the areas without metal, the areas of metal are narrower than the areas without metal, or any other appropriate relation between the widths. In various embodiments, periodic stripes 810 and periodic stripes 811 have the same width electrodes, have different width electrodes, or any other appropriate width electrodes. The widths of the areas with and without metal electrodes are typically on the order of 3 microns and 2 microns, respectively, for resonators designed to operate at 1 GHz; the metal electrode thickness is typically on the order of 100 to 300 nanometers. Note that every other metal electrode is coupled electrically together so that adjacent metal electrodes are not coupled electrically together. The magnitude of the electromechanical coupling factor of the piezoelectric resonator is a function of the relative width of the electrode compared to the width of the space between electrode areas. Periodic stripes 810 and periodic stripes 811 are arranged in such a manner that the areas with metal are directly over two sets of periodic stripes in the bottom metal electrode. Periodic stripes 810 are over a set of periodic stripes in the bottom metal electrode, where the set of periodic stripes in the bottom metal electrode are electrically coupled to periodic stripes 811. Periodic stripes 811 are over a set of periodic stripes in the bottom metal electrode, where the set of periodic stripes in the bottom metal electrode are electrically coupled to periodic stripes 810.

Contact strip 826 is coupled electrically to a middle metal layer in the resonator structure using via 822 and via 820. Contact strip 830 is coupled electrically to a middle metal layer in the resonator structure using via 824 and via 818.

Figure 9:
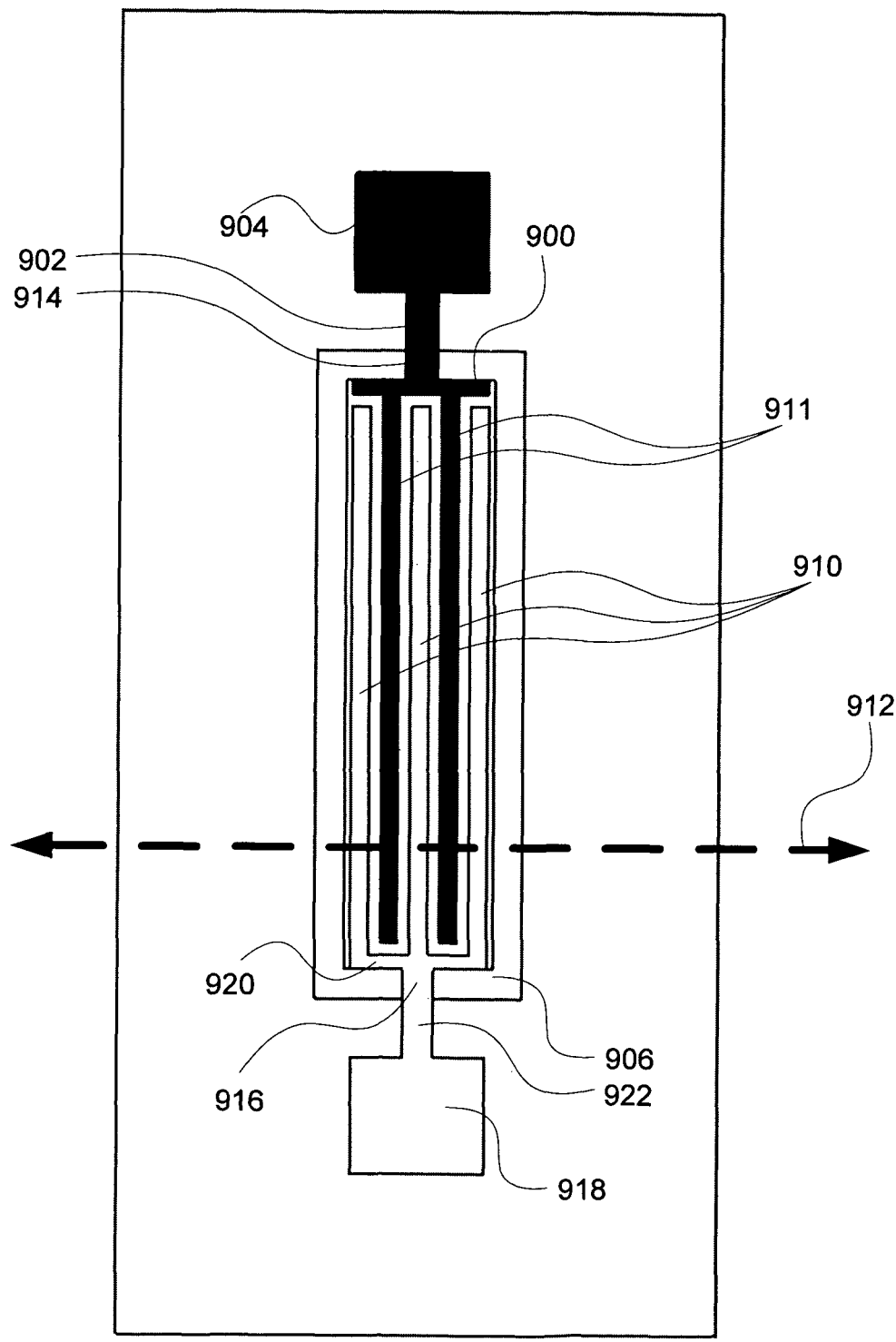
FIG. 9 is a diagram illustrating an embodiment of a top view of bottom metal electrodes of a piezoelectric resonator with two piezoelectric layers.

FIG. 9 is a diagram illustrating an embodiment of a top view of bottom metal electrodes of a piezoelectric resonator with two piezoelectric layers. In some embodiments, the metal electrodes of FIG. 9 are used to implement the metal electrodes associated with the resonator of FIG. 7. In the example shown, a resonator structure has bus 900 electrically coupled to periodic stripes 911 as part of a bottom layer metal electrode as seen from a top view. Bus 900 and periodic stripes 911 are coupled to connector 902 and via contact 904. Connector 902 crosses tether 914, which is used to suspend resonator structure. A resonator structure has bus 920 electrically coupled to periodic stripes 910 as part of a bottom layer metal electrode as seen from a top view. Bus 920 and periodic stripes 910 are coupled to connector 922 and via contact 918. Connector 922 crosses tether 916, which is used to suspend resonator structure.

The resonator structure is surrounded by space 906 and is coupled to the structure surrounding the resonator structure using tether 914 and tether 916. Periodic stripes 910 and periodic stripes 911 are inter-digitated and have areas with metal next to areas without metal along a direction perpendicular to an axis that would run between tether 914 and tether 916—for example, along axis 912. In various embodiments, the areas of metal and the areas without metal have the same width, the areas of metal are wider than the areas without metal, the areas of metal are narrower than the areas without metal, or any other appropriate relation between the widths. The widths of the areas with and without metal electrodes are typically on the order of 3 microns and 2 microns, respectively, for resonators designed to operate at 1 GHz; the metal electrode thickness is typically on the order of 100 to 300 nanometers. The magnitude of the electromechanical coupling factor of the piezoelectric resonator is a function of the relative width of the electrode compared to the width of the space between electrode areas. Periodic stripes 911 are arranged in such a manner that the areas metal are directly underneath periodic stripes 811. Periodic stripes 910 are arranged in such a manner that the areas metal are directly underneath periodic stripes 810.

Figure 10:
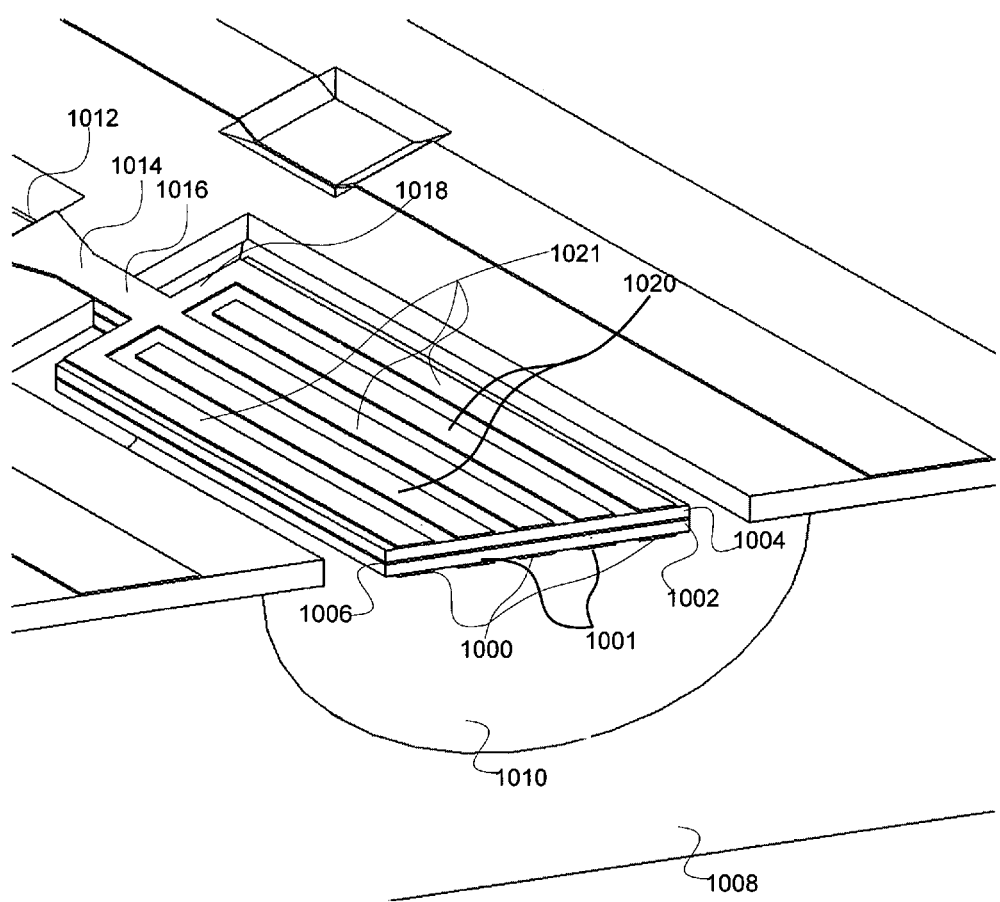
FIG. 10 is a block diagram illustrating an embodiment of a piezoelectric resonator with two piezoelectric layers.

FIG. 10 is a block diagram illustrating an embodiment of a piezoelectric resonator with two piezoelectric layers. In some embodiments, the resonator of FIG. 10 is used to implement the resonator of FIG. 7. In the example shown, periodic stripes 1021 are coupled electrically to bus 1018 which in turn is electrically coupled to connector 1014 and via 1012. Connector 1014 crosses tether 1016. Tether 1016 suspends a resonator structure over cavity 1010 within substrate 1008. The resonator structure comprises: 1) a top layer of metal electrodes including periodic stripes 1020, periodic stripes 1021, and bus 1018; 2) top piezoelectric layer 1004; 3) middle metal layer 1006; 4) bottom piezoelectric layer 1002; and 5) bottom layer of metal electrodes including periodic stripes 1000 and periodic stripes 1001. Top layer periodic stripes 1020 are centered over periodic stripes 1001. Top layer periodic stripes 1021 are centered over periodic stripes 1000. Top layer periodic stripes 1020 are electrically coupled to periodic stripes 1000. Top layer periodic stripes 1021 are electrically coupled to periodic stripes 1001.

Figure 11:
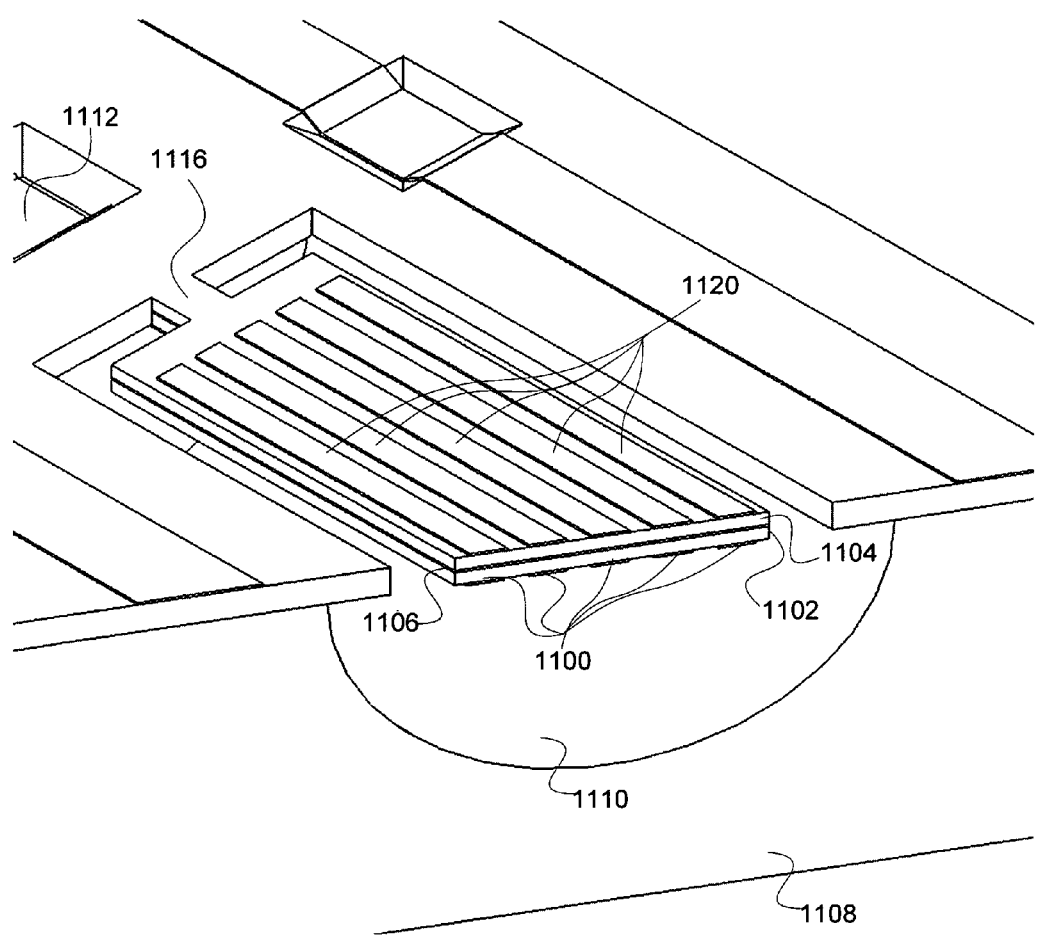
FIG. 11 is a block diagram illustrating an embodiment of a piezoelectric resonator with two piezoelectric layers.

FIG. 11 is a block diagram illustrating an embodiment of a piezoelectric resonator with two piezoelectric layers. In some embodiments, the resonator of FIG. 11 is used to implement the resonator of FIG. 7. In the example shown, periodic stripes 1100 are coupled electrically to via 1112. Tether 1116 suspends a resonator structure over cavity 1110 within substrate 1108. The resonator structure comprises: 1) a top layer of metal electrodes including periodic stripes 1120; 2) top piezoelectric layer 1104; 3) middle metal layer 1106; 4) bottom piezoelectric layer 1102; and 5) bottom layer of metal electrodes including periodic stripes 1100. Top layer periodic stripes 1120 are centered over periodic stripes 1100. Top layer periodic stripes 1120 are electrically coupled to each other. Bottom layer periodic stripes 1100 are electrically coupled to each other. Periodic stripes 1120 and periodic stripes 1100 each comprise a set of areas of metal and areas without metal. In some embodiments, the width of the top metal electrodes in the dimension along which the electrodes form a periodic structure is approximately 3 μm with a 2 μm space between the metal electrodes for an AlN piezoelectric resonator structure.

Figure 12:
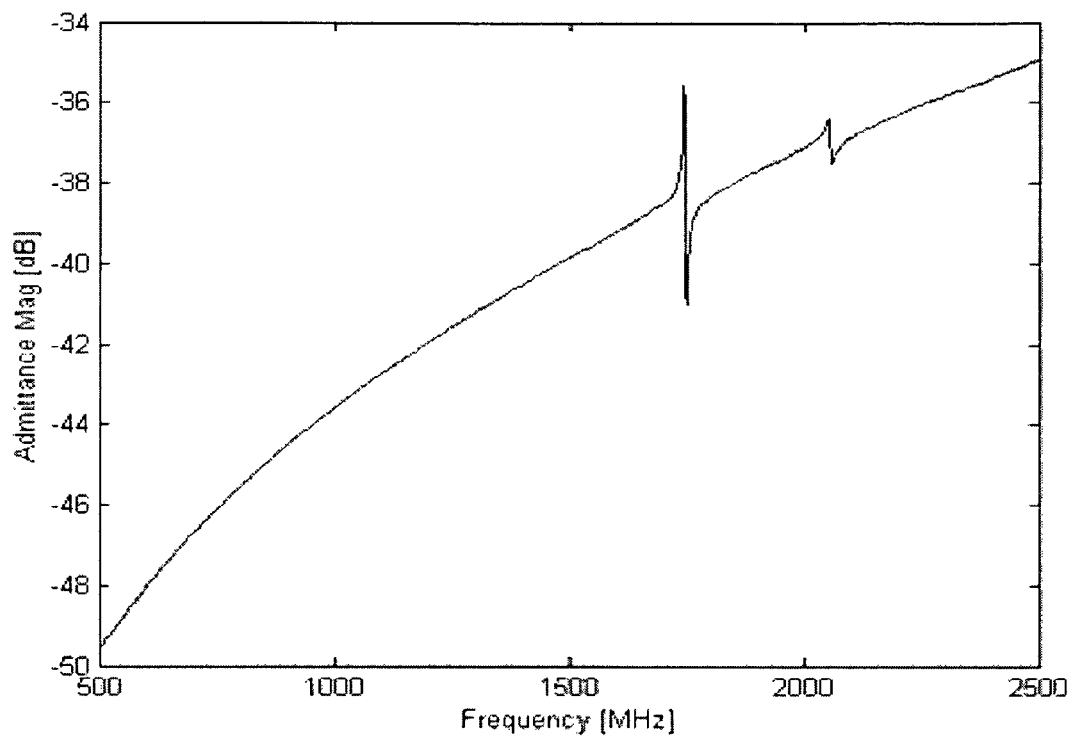
FIG. 12 is a graph illustrating a frequency response of the resonator structure in one embodiment.

FIG. 12 is a graph illustrating a frequency response of the resonator structure in one embodiment. In the examples shown, the magnitude of the admittance of a one port resonator structure (e.g., a resonator structure similar to FIG. 1, FIG. 2, FIG. 3, FIG. 4, FIG. 5, or FIG. 6) associated with electrode pattern 1200 is plotted for frequencies from 500 MHz to 2500 MHz. The resonator structure has a width of 75 μm, a length of 150 μm, and a thickness of 2 μm (each of the two piezoelectric layers is 1 μm thick); the piezoelectric structure is made out of aluminum nitride. Each metal electrode stripe is 2.5 μm wide and 150 nm thick; the electrodes are made out of aluminum. The resonator structure has a width corresponding to 30 half wavelengths. The fundamental frequency is 58 MHz (e.g., the elastic wave propagation associated frequency 1740/30 MHz). The fundamental width extensional mode of the structure and many of its overtones are suppressed. For example, the response of the overtones at 522 MHz, 580 MHz, 638 MHz, 696 MHz, 754 MHz, 812 MHz, 870 MHz, 928 MHz, 986 MHz, 1044 MHz, 1102 MHz, 1160 MHz, 1218 MHz, 1276 MHz, 1334 MHz, 1392 MHz, 1450 MHz, 1508 MHz, 1566 MHz, 1624 MHz, or 1682 MHz are not seen in FIG. 12. The small low Q peak near 2.1 GHz is due to a thickness extensional mode.

In some embodiments, the resonator structure comprises a circle or annular ring, where the periodic electrodes on the top and bottom layers are portions of arcs or circles.

In some embodiments, the resonator structure comprises a polygon other than a rectangle, where the periodic electrodes on the top and bottom layers are portions of inscribed polygons of the same type as the resonator structure.

In some embodiments, the resonator structure further comprises a sixth layer adjacent to the outside of the bottom layer of metal electrodes. The sixth layer, which is made of a low acoustic loss material (e.g., silicon, sapphire, nickel, diamond, silicon dioxide, or silicon carbide), acts as a resonant cavity for the mode of vibration and raises the quality factor of the piezoelectric resonator at the expense of lower electromechanical coupling. The sixth layer has the same lateral dimensions as the piezoelectric layers of the resonator structure. The sixth layer is between the bottom layer (e.g., the fifth layer electrode) and the substrate and is part of the layer stack that is suspended by tethers over the released cavity. The sixth layer cavity is between 1 and 100 μm thick.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A piezoelectric resonator device, comprising:
  a top layer including one or more top layer metal electrodes, wherein in a first area, the top layer includes a top layer patterned structure;
  a top piezoelectric layer comprising a first piezoelectric material, wherein the top piezoelectric layer is adjacent to the top layer;
  a middle layer including one or more middle layer metal electrodes, wherein the middle layer is adjacent to the top piezoelectric layer opposite the top layer;
  a bottom piezoelectric layer comprising a second piezoelectric material, wherein the bottom piezoelectric layer is adjacent to the middle layer opposite the top piezoelectric layer; and
  a bottom layer including one or more bottom layer metal electrodes, wherein the bottom layer is adjacent to the bottom piezoelectric layer opposite the middle layer, and wherein in a second area, the bottom layer includes a bottom layer patterned structure, wherein the top layer metal electrodes include a first plurality of electrodes inter-digitated with a second plurality of electrodes, wherein a first one of the inter-digitated metal electrodes in the top layer and a first one of the metal electrodes in the bottom layer are coupled to a first contact configured to provide a first signal, and a second one of the inter-digitated metal electrodes in the top layer and a second one of the metal electrodes in the bottom layer are coupled to a second contact configured to provide a second signal;

the layers suspended over a cavity by tethers;

the top layer patterned structure or the bottom layer patterned structure controlling a resonant frequency response of the piezoelectric resonator device.

2. A device as in claim 1, wherein the first contact is configured to receive the first signal.

3. A device as in claim 2 wherein the second contact is configured to receive the second signal.

4. A device as in claim 2, wherein the second contact is configured to output the second signal.

5. A device as in claim 1, wherein the first contact is associated with a first port.

6. A device as in claim 5, wherein the second contact is associated with a second port.

7. A device as in claim 6, wherein the middle layer is coupled to ground.

8. A device as in claim 1, wherein the top layer patterned structure and the bottom layer patterned structure are aligned so that one of the one or more bottom layer metal electrodes is centered under a space with no top layer metal electrodes and one of the one or more top layer metal electrodes is centered over a space with no bottom layer metal electrodes.

9. A device as in claim 1, wherein the top layer patterned structure and the bottom layer patterned structure are aligned so that one of the one or more bottom layer metal electrodes is centered under one of the one or more top layer metal electrodes.

10. A device as in claim 1, wherein the one or more top layer metal electrodes comprise one of the following: aluminum, platinum, molybdenum, gold, silver, nickel, or ruthenium.

11. A device as in claim 1, wherein the one or more bottom layer metal electrodes comprise one of the following: aluminum, platinum, molybdenum, gold, silver, nickel, or ruthenium.

12. A device as in claim 1, wherein the middle metal layer comprises one of the following: aluminum, platinum, molybdenum, gold, silver, nickel, or ruthenium.

13. A device as in claim 1, wherein the first piezoelectric material and the second piezoelectric material comprises one of the following: aluminum nitride, zinc oxide, lead zirconate titanate, quartz, gallium arsenide, or lithium niobate.

14. A device as in claim 1, wherein the one or more top layer metal electrodes have a width along the one dimension that is not a full half period associated with the one or more top layer metal electrodes.

15. A device as in claim 1, wherein the one or more bottom layer metal electrodes have a width along the one dimension that is not a full half period associated with the one or more top layer metal electrodes.

16. A piezoelectric resonator device, comprising:
a top layer including top layer metal electrodes, wherein in a first area, the top layer includes a top layer periodic structure;
a top piezoelectric layer comprising a first piezoelectric material, wherein the top piezoelectric layer is adjacent to the top layer;
a middle layer including one or more middle layer metal electrodes, wherein the middle layer is adjacent to the top piezoelectric layer opposite the top layer;
a bottom piezoelectric layer comprising a second piezoelectric material, wherein the bottom piezoelectric layer is adjacent to the middle layer opposite the top piezoelectric layer; and
a bottom layer including bottom layer metal electrodes, wherein the bottom layer is adjacent to the bottom piezoelectric layer opposite the middle layer, and wherein in a second area, the bottom layer includes a bottom layer periodic structure, wherein the top layer metal electrodes include a first plurality of electrodes inter-digitated with a second plurality of electrodes, wherein one of the inter-digitated first plurality of top layer metal electrodes and a first one of the bottom layer metal electrodes are coupled to a first contact configured to provide a first signal, and one of the inter-digitated second plurality of top layer metal electrodes and a second one of the bottom layer metal electrodes are coupled to a second contact configured to provide a second signal;
the layers suspended over a cavity by tethers;
the top layer periodic structure or the bottom layer periodic structure corresponding to a resonant frequency response of the piezoelectric resonator device.

17. A device as in claim 16, wherein the first plurality of top layer metal electrodes are coupled electrically to each other, and wherein the second plurality of top layer metal electrodes are coupled electrically to each other.

18. A device as in claim 16, wherein the bottom layer metal electrodes include a first plurality of electrodes inter-digitated with a second plurality of electrodes.

19. A device as in claim 18, wherein the first plurality of bottom layer metal electrodes are coupled electrically to each other, and wherein the second plurality of bottom layer metal electrodes are coupled electrically to each other.

20. A device as in claim 18, wherein the first plurality of top layer metal electrodes are coupled electrically to the second plurality of bottom layer metal electrodes, and wherein the second plurality of top layer metal electrodes are coupled electrically to the first plurality of bottom layer metal electrodes.

21. A piezoelectric resonator device, comprising:
a top layer including top layer metal electrodes, wherein in a first area, the top layer includes a top layer periodic structure;
a top piezoelectric layer comprising a first piezoelectric material, wherein the top piezoelectric layer is adjacent to the top layer;
a middle layer including one or more middle layer metal electrodes, wherein the middle layer is adjacent to the top piezoelectric layer opposite the top layer;
a bottom piezoelectric layer comprising a second piezoelectric material, wherein the bottom piezoelectric layer is adjacent to the middle layer opposite the top piezoelectric layer; and
a bottom layer including one or more bottom layer metal electrodes, wherein the bottom layer is adjacent to the bottom piezoelectric layer opposite the middle layer, and wherein in a second area, the bottom layer includes a bottom layer periodic structure, wherein the top layer metal electrodes include a first plurality of electrodes inter-digitated with a second plurality of electrodes, wherein one of the inter-digitated first plurality of top layer metal electrodes and a first one of the bottom layer metal electrodes are coupled to a first contact configured to provide a first signal, and one of the inter-digitated second plurality of top layer metal electrodes and a second one of the bottom layer metal electrodes are coupled to a second contact configured to provide a second signal; and
a sixth layer adjacent to the bottom layer opposite the bottom piezoelectric layer.

22. A device as in claim 21, the sixth layer comprising a low acoustic loss material.

23. A device as in claim 22, the low acoustic loss material selected from the group consisting of: silicon, sapphire, nickel, diamond, silicon dioxide, and silicon carbide.

24. A device as in claim 21, the sixth layer having substantially similar lateral dimensions as the top piezoelectric layer.

25. A piezoelectric resonator device, comprising:
- a top layer including a plurality of top layer metal electrodes having a patterned structure, wherein at least one of the top layer metal electrodes is coupled to a contact configured to provide a signal;
- a top piezoelectric layer comprising a first piezoelectric material, wherein the top piezoelectric layer is adjacent to the top layer;
- a middle layer including one or more middle layer metal electrodes, wherein the middle layer is adjacent to the top piezoelectric layer opposite the top layer, wherein the one or more middle layer metal electrodes are coupled to ground;
- a bottom piezoelectric layer comprising a second piezoelectric material, wherein the bottom piezoelectric layer is adjacent to the middle layer opposite the second ton piezoelectric layer; and
- a bottom layer including a plurality of bottom layer metal electrodes having a patterned structure, wherein the bottom layer is adjacent to the bottom piezoelectric layer opposite the middle layer, wherein at least one of the bottom layer metal electrodes is coupled to a contact configured to provide the signal;
- the layers suspended over a cavity by tethers;
- the top layer patterned structure or the bottom layer patterned structure controlling a resonant frequency response of the piezoelectric resonator device.

26. A device as in claim 25, wherein the top layer patterned structure and the bottom layer patterned structure are aligned so that one or more of the bottom layer metal electrodes is centered under a space with no top layer metal electrodes and one or more of the top layer metal electrodes is centered over a space with no bottom layer metal electrodes.

27. A device as in claim 25, wherein the top layer patterned structure and the bottom layer patterned structure are aligned so that one or more of the bottom layer metal electrodes is centered under one or more of the top layer metal electrodes.

* * * * *